US005132648A

United States Patent [19]

Trinh et al.

[11] Patent Number: 5,132,648

[45] Date of Patent: Jul. 21, 1992

[54] LARGE ARRAY MMIC FEEDTHROUGH

[75] Inventors: Trang N. Trinh, Cypress; Elroy C. Smith, Jr., La Habra, both of Calif.

[73] Assignee: Rockwell International Corporation, Seal Beach

[21] Appl. No.: 540,964

[22] Filed: Jun. 8, 1990

[51] Int. Cl.$^5$ .......................... H01P 5/12; H05K 7/14

[52] U.S. Cl. .................................... 333/128; 333/136; 333/247; 343/853; 361/414

[58] Field of Search ............... 333/136, 128, 246, 247; 343/700 MS, 853; 361/383, 392-395, 400, 414, 412; 174/250, 253, 255, 260

[56] References Cited

U.S. PATENT DOCUMENTS

| | | | |
|---|---|---|---|
| 3,777,220 | 12/1973 | Tatusko et al. | 174/255 X |
| 4,371,744 | 2/1983 | Badet et al. | 174/262 X |
| 4,407,007 | 9/1983 | Desai et al. | 357/80 X |
| 4,636,755 | 1/1987 | Gibbs | 333/128 X |
| 4,724,283 | 2/1988 | Shimada et al. | 361/414 X |
| 4,725,925 | 2/1988 | Tanaka et al. | 174/260 X |
| 4,821,142 | 4/1989 | Ushifusa et al. | 361/395 |
| 4,837,408 | 6/1989 | Kondo et al. | 361/414 X |
| 4,899,118 | 2/1990 | Polmski, Sr. | 333/246 |
| 4,907,128 | 3/1990 | Solomon et al. | 361/412 |
| 4,922,377 | 5/1990 | Matsumoto et al. | 361/414 X |
| 4,929,959 | 5/1990 | Sorbello et al. | 343/700 MS |

OTHER PUBLICATIONS

McIlvenna, "Monolithic Phased Arrays for EHF Communications Terminals", Microwave Journal, Mar. 1988, pp. 113-117, 121-124.

*Primary Examiner*—Eugene R. LaRoche

*Assistant Examiner*—Seurg Ham

*Attorney, Agent, or Firm*—H. Fredrick Hamann; George A. Montanye; Tom Streeter

[57] ABSTRACT

A method and apparatus are disclosed for manufacturing large Monolithic Microwave Integrated Circuit (MMIC) arrays. MMIC elements are manufactured on a substrate to form a MMIC module and first conductive vias are created in the substrate at locations corresponding to contact points for the MMIC. The MMIC module is then secured to a multi-layered ceramic backplate structure for physical rigidity and electrical interconnection. The MMIC module uses a conductive material, such as chrome, to fill or coat the vias to provide electrical contact with MMIC contact pads. Each layer of the multi-layered backplate structure has an electrical interconnection circuit or network formed thereon, and conductive vias extending through the layer at locations corresponding to preselected vias in adjacent layers and electrical contacts for MMIC modules. In further aspects of the invention, portions of the backplate also support phase control integrated circuit logic elements or devices which are electrically connected to the MMICs through the interconnection circuits to reduce off-structure connections. The backplate uses a multi-layer hybrid technique in conjunction with the via holes on the MMIC substrate to form a low cost and reliable feeding network for a large MMIC array, such as a phased-array. The invention uses RF power distribution structures in combination with advanced fabrication and assembly techniques to eliminate individually fabricated RF feedthroughs.

13 Claims, 7 Drawing Sheets

LARGE ARRAY MMIC FEEDTHROUGH

BACKGROUND OF THE INVENTION

1. Field of the Invention

The present invention relates to radio frequency or microwave circuits and antennas and more particularly to a method and apparatus for transferring radio frequency and phase control signals between a backplate support structure and monolithic microwave integrated circuits. The invention further relates to integration of monolithic via holes on the backside of monolithic integrated circuits with hybrid conductive vias in a backplate which incorporates material exhibiting high mechanical stability and thermal conductivity, and also supports phase control logic integrated circuits.

2. Related Technical Art

Communication and navigation systems, tactical and strategic sensors, and electronic warfare systems are some of the applications currently benefiting from the use of Monolithic Microwave Integrated Circuit (MMIC) technology. This technology employs high-volume, automated production and batch fabrication techniques to fabricate fully integrated circuits having arrays of antenna elements, associated power amplifiers, phase-shifters, and requisite mounting and interconnection structures on single wafers or substrates to reduce cost and imporve system reliability. In addition, the level of miniaturization and extremely accurate element positioning required for advanced signal processing applications are only achievable using maximum monolithic integration of the circuit functions.

Advanced phased-array applications generally dictate a very large number of antenna elements in the array to support high gain or large sweep angle requirements. In typical applications being developed, such as Extra High Frequency (EHF) 20 to 50 GHz antennas, a given array consists of from 3000 to 5000 antenna elements in a rectangular array. The face of each array is also covered with the associated amplifier and phase shifter elements which are interspersed between the antenna elements. In a typical phased array, the antenna element spacing is about one half of the desired free-space wavelength. At a frequency of 40 GHz, the wavelength is about 0.295 inches, which requires an array on the order of 8–10 inches on a side to accommodate the desired number of elements.

Unfortunately, the desired array sizes are typically ten to one hundred times larger than MMICs can be manufactured while maintaining reasonable yields and performance. Therefore, monolithic phased-element-arrays for use in extremely high frequency transmitters and receivers represent an application of MMIC technology that is also being developed using backplate technology. That is, an array of MMICs with their individual or sub-arrays of antenna elements, and associated integrated circuit components, are supported on a backplate to provide a rigid support and electronic signal transfer and interconnection structure.

Signals for controlling individual MMIC amplifier functions and phase shifter operations, as well as the desired radio frequency signals to be processed, must be routed to each MMIC in the array supported by the backplate, and each MMIC element in a sub-array. Most MMICs have electrical contact pads or connection points along their top edges, to allow for connection to very fine bond wires, ribbons, or miniature cables. The bond wires are used to connect the MMICs to various DC biasing or control signal sources. In the standard approach, small coaxial cables are employed to transfer RF type signals and prevent or reduce interference for adjacent antenna elements.

In conventional techniques, precision hand-work is required for connecting gold ribbon, bond wire, or coaxial cables to each contact pad. In addition, free volume or space is required to accommodate wires as they are fed around the edges or over the surface of each MMIC for connection to other apparatus. An alternative is to use large diameter passages extending through the MMIC which allow for the passage of small cables or wires through the MMIC for connection to other apparatus. Unfortunately, this undesirably consumes additional MMIC surface area and presents problems with element spacing.

The present MMIC interconnection structures are very labor intensive to construct and inspect. For large arrays having thousands of elements, the cost of labor often becomes prohibitive for all but advanced military applications. Even with modern automated assembly equipment, the construction time is very lengthy because the interconnection scheme is highly complex. Complexity and labor intensive fabrication also reduces functioning array or sub-array yield. At the same time, the large number of jumper type connections decreases array reliability by increasing damage due to handling and mechanical stress.

Current MMIC arrays also tend to be customized structures with variations in reliability and performance characteristics from array to array. Exact power requirements, channel cross-talk, and packaging problems vary from array to array. This lack of reproducibility and manufacturing consistency prevents wider application of MMIC arrays.

In addition to interconnection problems, many arrays must accommodate high power signals and temperature variations between −54° C. to +71° C., which also requires some form of thermal stabilization to counter material stress. Antenna arrays may also need to have sufficient physical strength to act as load bearing surfaces, such as in airplane skins, and match certain surface configurations.

What is needed is a method of producing large MMIC arrays, such as for phased-array antennas and the like, with reduced fabrication complexity and cost, and with increased manufacturing throughput and reliability. It is desirable to improve array-to-array reproducibility while reducing problems with array handling and interconnection. At the same time, any new method or design should also improve thermal stability.

SUMMARY

In view of the above problems associated with the art, it is one purpose of the present invention to provide a less complex method of assembling a large array of MMICs that greatly reduces cost and time in manufacturing an array.

Improved fabrication is realized by providing a low cost and reliable RF feed and DC biasing interconnection network for a large MMIC array.

Another purpose of the invention is to provide a more compact and reliable MMIC array assembly technique.

An advantage of the present invention is that it provides MMIC arrays with increased reliability and array-to-array reproducibility.

Another advantage of the present invention is that it can provide a more complex interconnection scheme at lower cost with reduced manufacturing complexity or time.

The present invention also provides the advantage of increased thermal stability and reduced mechanical stress.

Yet another purpose of the invention is to provide a method of reducing interconnection requirements for off-array processing.

The invention further provides a MMIC array structure that can have a variety of conformal profiles.

Additional advantages of the invention are that the support backplate can be tested independent of sensitive MMIC sub-arrays, and handling concerns are greatly reduced since all critical RF and DC lines are buried within backplate layers.

These and other objects, purposes, and advantages are realized in the present invention in which a backplate apparatus for supporting an array of Monolithic Microwave Integrated Circuits (MMICs) is provided which comprises a plurality of electrically insulating material layers, with electrical interconnection circuits or networks formed thereon, secured together to form a multi-layer interface and support board. Each layer has conductive vias extending through the layer at locations corresponding to preselected electrical contact points for circuitry on the MMICs. The interconnection circuits are configured for connection to selected ones of the conductive vias. The uppermost insulating layer is also provided with a means for securing MMICs in place on the interface board.

In further aspects of the invention, each of the insulating material layers are preferably made from a ceramic material, such as an alumina compound, in order to improve thermal expansion properties of the interface board. The insulating layers are substantially planar ceramic layers which can be curved or molded during manufacture to configure to specialized surface shapes where desired.

The multi-layer ceramic interface board is preferably manufactured using a plurality of uncured ceramic material layers, each having a predetermined thickness, on which desired conduction circuits are deposited. An exemplary form of ceramic is uncured or green ceramic tape. Vias are formed in the ceramic layers, using techniques such as stamping, at locations determined by the relative position of each layer in the interface board and contact points for the MMICs. The vias are filled with a conductive material which is deposited in the vias so as to extend through the layers in which the vias reside. Exemplary conductive materials are silver, platinum/gold, gold, or other high conductivity compounds in liquid or ink-type form. The ceramic layers are stacked on each other and aligned so that selected ones of the conductive vias in one or more layers are aligned with corresponding conductive vias in adjacent layers. This structure is then co-fired to fuse the individual layers into a single or unitized multi-layer board and form linked conductive vias extending through the board.

The conductive vias in each material layer are aligned with mating conductive vias in adjacent material layers so as to form composite electrically conductive vias extending through the material layers along a direction transverse to the layers. In most applications, each composite via begins in a preselected lower material layer and extends through the material layers along a single direction only and terminates in an uppermost layer adjacent to the MMICs.

The interconnection circuits are formed from electrically conductive material deposited on each ceramic layer in the form of a preselected electrical interconnection pattern associated with the MMIC contacts. Exemplary conductive materials are thick film silver, platinum/gold, or gold.

At least one of the electrical interconnection circuits deposited on one insulating layer forms a power divider for connection of a single RF transfer line to selected conductive vias which correspond to a plurality of RF transfer contacts for the MMIC. At least one of the electrical interconnection circuits deposited on an adjacent insulating layer acts as a ground plane for the power divider. In many applications, it is preferable to employ a single RF corporate feed structure.

Typically, a layer of solder material, such as an Indium solder compound, is used to join the MMIC module to an upper layer of the interface board. However, other materials may be employed.

The preferred embodiment of the invention further comprises phase control elements or devices mounted on a periphery portion of the interface board on one or more of the material layers. The phase control devices provide signals for controlling phase shifting functions on the MMICs. Exemplary phase control devices are integrated circuit logic elements or devices. The material layers used to support phase control devices are manufactured to extend beyond the dimensions of MMICs to be supported by the interface board. The phase control devices are electrically connected to the MMICs through at least one of the interconnection circuits deposited on an insulating layer.

A desired MMIC assembly or module which is to be connected to the ceramic interface board, is formed using known circuit fabrication techniques. The monolithic microwave integrated circuit is typically manufactured as a MMIC module in which a desired monolithic microwave integrated circuit is formed on a generally planar substrate. The module substrate is made from an electrically semi-insulating or insulating material, such as a predetermined thickness of GaAs. The module is made with a series of conductive vias extending through the substrate at locations corresponding to, and in alignment with, desired contact points or pads for the monolithic microwave integrated circuit elements. The contacts provide transfer points for RF, DC bias, and phase control signals processed by the MMIC.

The module vias are manufactured using conventional etching techniques with surface contacts typically operating as stop-etch controls. The conductive vias generally have a frustra-conical configuration with a narrower upper portion which is positioned adjacent to the MMIC contacts. The wider via base is positioned to contact the interface board. The entire back surface of the MMIC module is coated with a conductive material such as chrome, which fills or coats the vias to provide contact with the MMIC contact pads. The conductive coating is deposited with insulating or isolation gaps surrounding each via to prevent direct electrical interconnection or shorting to adjacent vias. Alternatively, the etched vias are first coated or filled with an electrically conductive material such as thick film silver, gold, or platinum/gold.

The MMIC module substrate is aligned with the ceramic interface board so that conductive vias in the interface board are in alignment with corresponding vias in the substrate. The board and substrate are then joined together by soldering. Solder material is applied to an upper metal layer on the ceramic board which is generally heated to provide uniform solder flow while the substrate, with the conductive coating bonded to the lower surface, is applied to the ceramic board.

BRIEF DESCRIPTION OF THE DRAWINGS

The novel features of the present invention may be better understood from the accompanying description when taken in conjunction with the accompanying drawings in which.

DESCRIPTION OF PREFERRED EMBODIMENTS

The present invention provides a method and apparatus for constructing large MMIC arrays which are useful for transmitting or receiving antenna systems. The invention uses established RF power distribution structures in combination with advanced fabrication and assembly techniques to eliminate individually fabricated RF feedthroughs. Known monolithic microwave integrated circuit elements are manufactured on a substrate to form a MMIC assembly or module which is secured to a multi-layered ceramic backplate structure for physical rigidity and electrical interconnection. The backplate uses a multi-layer hybrid technique in conjunction with via holes on the MMIC assembly substrate to form a low cost and reliable feeding network for a large MMIC array, such as a phased-array. Portions of the backplate also support phase control IC devices to reduce off-board connection requirements.

A variety of MMIC patterns and functional elements have been developed by various manufacturers and researchers which provide signal transmission or reception, amplification, and phase control. Such circuits comprise a variety of antenna elements of differing size and configuration, associated signal coupling and feedline structures, low noise amplifiers, specialized FETs, delay lines, and phase shifter components. These circuits are well known in the art and are not described in detail here. A review of these types of circuits can be seen in the article entitled "Monolithic Phased Arrays for EHF Communications Terminals" written by John F. McIlvenna, as it appeared in the Microwave Journal in March 1988, on pages 113-125, and which is incorporated herein by reference.

Figure 1:
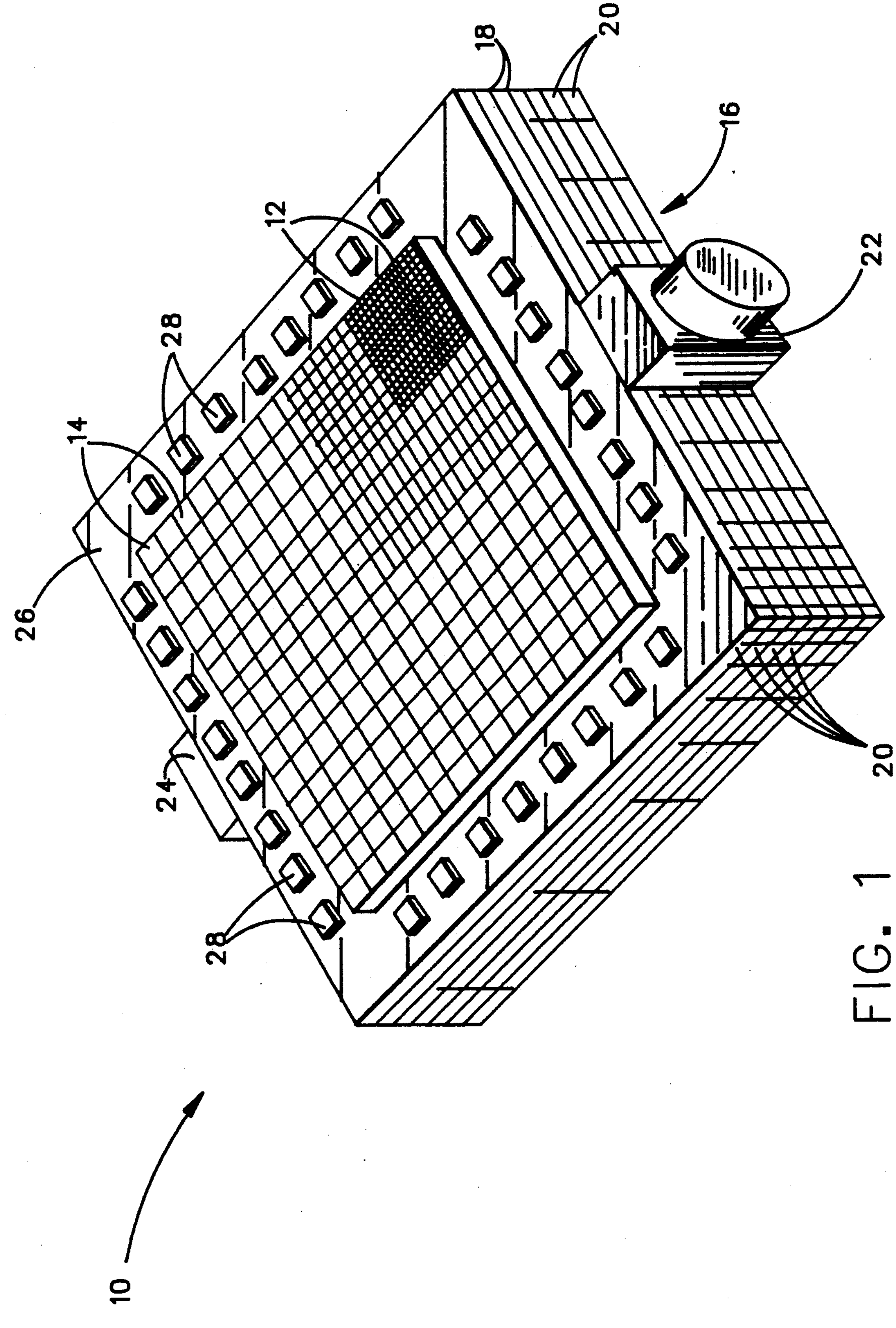
FIG. 1 illustrates a perspective view of a MMIC array and backplate assembly constructed according to the present invention.

An exemplary phased-array antenna structure using MMIC elements and constructed according to the present invention, is illustrated in perspective view in FIG. 1. In FIG. 1, a complete MMIC array and backplate assembly 10 is shown having a rectangular array of MMIC elements 12 distributed across the surface of a support backplate 16. The MMIC elements 12 are illustrated as squares which include antenna elements and associated circuit elements. The MMIC elements 12 are grouped together into sub-arrays of four or more MMICs manufactured on a common substrate to form MMIC modules 14. Those skilled in the art will recognize that various sizes of sub-arrays may be employed as determined by useful substrate dimensions, the MMIC element dimensions, required antenna element separation, and desirable MMIC interconnections. For purposes of clarity in illustration, the MMIC elements 12 are shown as arrays of individual elements in the lower right corner of the array assembly 10 and simply as sub-arrays of elements with decreasing detail across the remainder of the assembly.

The MMIC modules 14 are secured to the upper surface of the support and interconnection backplate 16. The backplate or interface board 16 is a multi-layered structure with interconnection circuits or material 18 interposed between layers of insulating material 20. Each layer 20 also has a series of conductive vias, not shown, extending through it to provide for electrical connections to selected adjacent layers or the MMIC modules 14. Conductors in the backplate 16, further connect the interconnection circuits 18 to one or more electronic signal connectors 22 and 24 which are used to transfer signals between the array assembly 10 and external apparatus.

The backplate 16 is shown as having a larger areal dimension than the grouped MMIC modules 14. This larger area is used to define a support region 26 around the periphery of the array assembly 10 to support a series of phase-control logic devices 28. The devices 28 are connected to various MMIC elements 12 through some of the interconnection circuits 18 in the backplate 16. The devices 28 act to control phase-shifters or similar elements to affect signal phase control.

Figure 2:
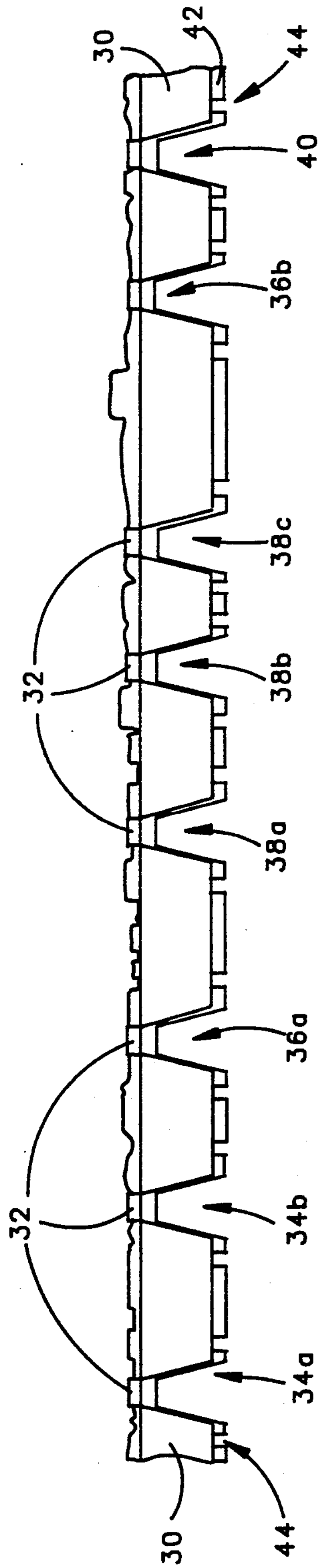
FIG. 2 illustrates a MMIC module for use in the array of FIG. 1, with via holes etched through the module substrate.

A representative MMIC module 14 is illustrated in further detail in the side view of FIG. 2. In FIG. 2, the MMIC module 14 employs a support substrate 30 on which individual MMICs or circuit elements are manufactured. The individual MMICs 12 are constructed by using known integrated circuit fabrication or manufacturing techniques (photoresist deposition, developing, masking, etching, ion implantation, planarization, etc.) to form desired microwave circuit elements on, or embedded in, the wafer or substrate 30. Besides the desired circuit and antenna elements, the MMIC substrate or wafer 30 provides a large amount of interconnection between circuit elements. This interconnection includes conduction paths for RF and DC bias signals.

The present invention utilizes conventional design principles for the MMICs except for provisions for off-chip signal transfer. In the present invention, signal transfer is accomplished through deposited contact points or plated contact pads 32 that are located across the substrate 30 surface and not just along the edges. The use of contact pads 32 allows reduced complexity for circuit conduction paths and decreases the area required for accommodating signal transfer.

The substrate 30 comprises known materials such as, but not limited to, Gallium Arsenide (GaAs). GaAs is a preferred material because of its electrical characteristics at extra high frequencies and excellent thermal properties for interfacing with ceramic materials, as disclosed below. While those skilled in the art will readily understand that GaAs has advantages for many applications, other semiconductor or insulating material combinations such as silicon, indium phosphide, or silicon-on-sapphire may be used within the teaching of this invention. The materials employed depend upon the manufacturing and circuit requirements of the specific application. In addition, by using techniques such as ion doping or molecular beam epitaxy, the substrate 30 can be doped or deposited in layers, or deposited in combination with varying concentrations of other materials, such as aluminum (GaAlAs). This allows a great deal of flexibility in manufacturing desired monolithic microwave circuit elements.

Once the desired circuitry has been deposited, etched, or otherwise established on the substrate 30, it is thinned, such as by lapping and polishing, to a thickness of about 125 μm. The exact thickness is generally not critical, except that structural integrity for a given application must be maintained, but a minimum amount of material is desired. It is desirable to provide a very thin surface through which vias are etched in later steps.

Once the MMIC module 14 is formed and substrate 30 prepared, a series of conduction or contact vias 34–40 are created that extend through the substrate 30. The vias 34–40 extend down to the MMIC circuit level wherever a control, bias, RF, or other signal feedthrough to a MMIC circuit contact 32 is desired. In addition, some vias, not shown, may extend completely through the substrate 30 solely for alignment or off-surface contact or bonding purposes.

The vias 34 are formed using techniques known to those skilled in the art for etching and patterning GaAs, or materials comprising the substrate 30. The vias are typically formed by etching the substrate and using the deposited or plated metal contact pads 32 as a stop-etch during this process to simplify manufacturing control. In the preferred embodiment, the conductive vias 34–40 are generally frustra-conical in shape and flare out at the bottom of each via where it will interface with a corresponding backplate via.

Figure 3:
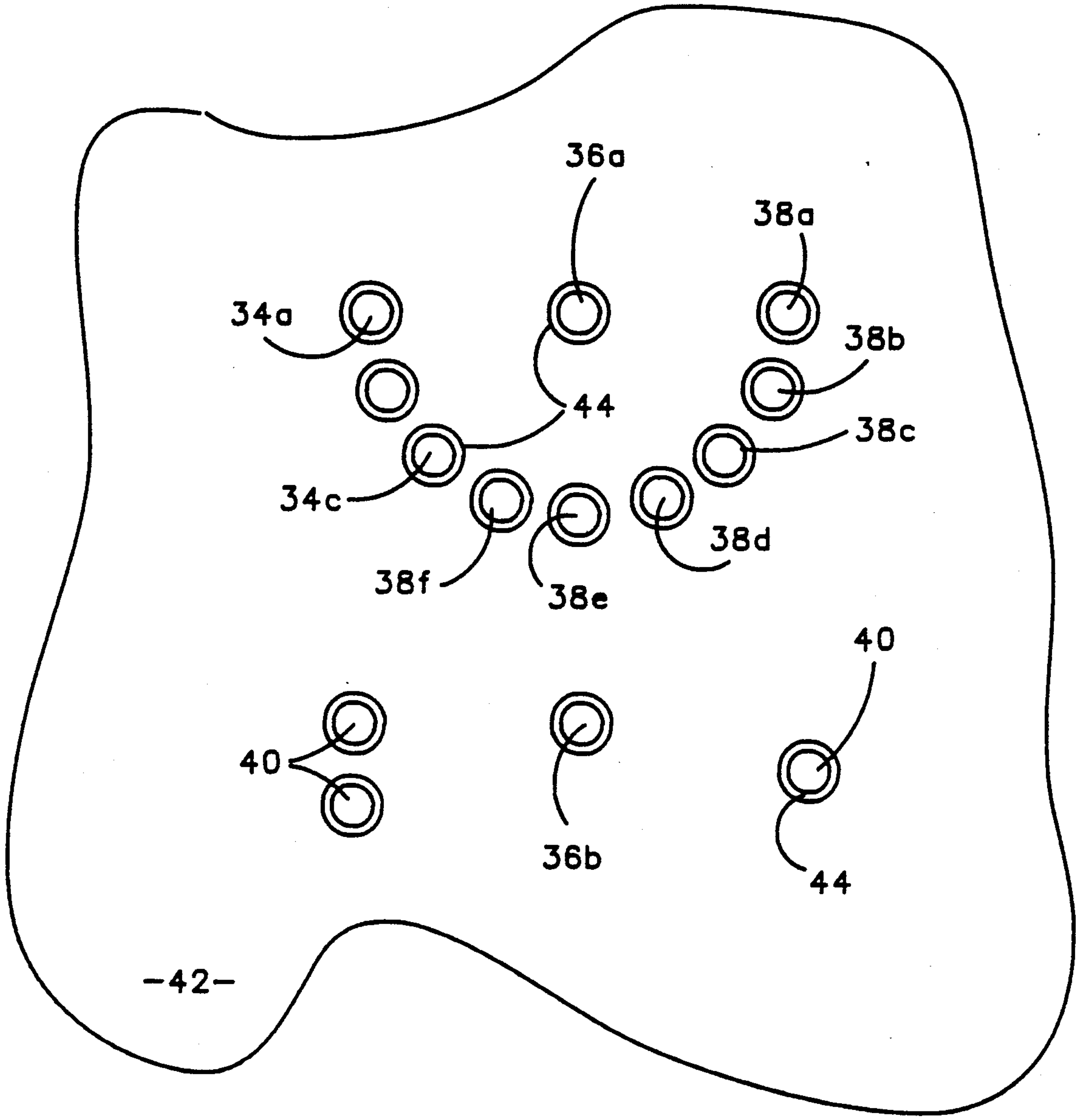
FIG. 3 illustrates a bottom view of an exemplary via pattern for the substrate of FIG. 2.

An exemplary pattern for the location of vias on the substrate 30 is illustrated in FIG. 3 where vias for amplifier bias, phase-control, and RF signals are shown. FIG. 3 presents a partial bottom view of one module 14 and represents only a portion of the large number of vias that would be used in a large array. The embodiment of FIG. 3 uses RF conductive vias surrounded by a series of DC amplifier and phase control vias. The separation distance between the RF and DC vias is relatively large to minimize interference or signal coupling. This pattern allows efficient use of area while keeping adjacent RF vias isolated. In FIG. 3, the vias **34*a*–34*c* are used to provide a series of amplifier contacts while the vias 36*a* and 36*b* are reserved for RF signal feedthrough. The vias 38*a*–38*f* are provided for control signals, such as for phase control, with the vias 40** being provided for other types of control or selection signals.

When the formation of the conductive or contact vias 34–40 in the MMIC module 14 is completed, the back or bottom surface, non MMIC element side, of the substrate 30 is plated with a metallic material to provide a conductive coating 42. This metal layer extends both across the substantially planar bottom surface of the substrate 30 as well as along the walls of the vias 34–40. Chrome has been found useful for this coating due to its high strength which is useful in subsequent bonding steps. However, those skilled in the art will recognize that other metals or metallic compounds and alloys can be employed for the coating 42 within the teachings of the invention.

Conventional deposition and masking techniques are used to achieve the desired metal coating. Additional material layers can be employed where desired to assure adequate electrical connection and mechanical strength for the coating layer 42. In addition, the entire volume of the vias 34–40 can be filled with conductive material, however, this generally represents an unnecessary use of material and increased processing time.

As seen in FIGS. 2 and 3, a small annular gap 44 is formed or etched in the layer or plating 42 around each via hole 34–40 to provide necessary ground, RF, and DC bias isolation, except for ground connection vias. In the illustrated embodiment, the ground for the bottom of the MMIC module 14 represents both RF and DC type grounds. Once a conductive via pattern has been established and the bottom of the module 14 coated, the MMIC module 14 is ready for mating with an array backplate which is specially configured and manufactured for this new type of interconnection.

The array backplate 16 of the present invention, uses a plurality of electrically insulating material layers interposed with electrically conductive layers that are processed to create a unitary backplate "board" with multiple layers of embedded circuitry. The traditional labor intensive vertical pins or cables found in current backplate designs are replaced with a new hybrid conductor structure to provide improved performance, improved reliability, and lower cost.

In the preferred embodiment, the insulating material layers consist of a series of ceramic layers interposed with conductive layers which are then fired to create a unitary ceramic "board". A ceramic material is preferred for its thermal and mechanical properties. The array backplate 16 utilizes a stripline corporate feed network to provide RF signal connections for the MMIC modules 14. For receivers, RF signals received by individual antenna elements are combined to provide a central RF output. For transmitters, RF signals are power divided from a single RF source to yield individual array power for each radiating element. The construction of stripline RF feeds and circuits on insulating material such as ceramic is a well understood EHF technology.

Figure 4:
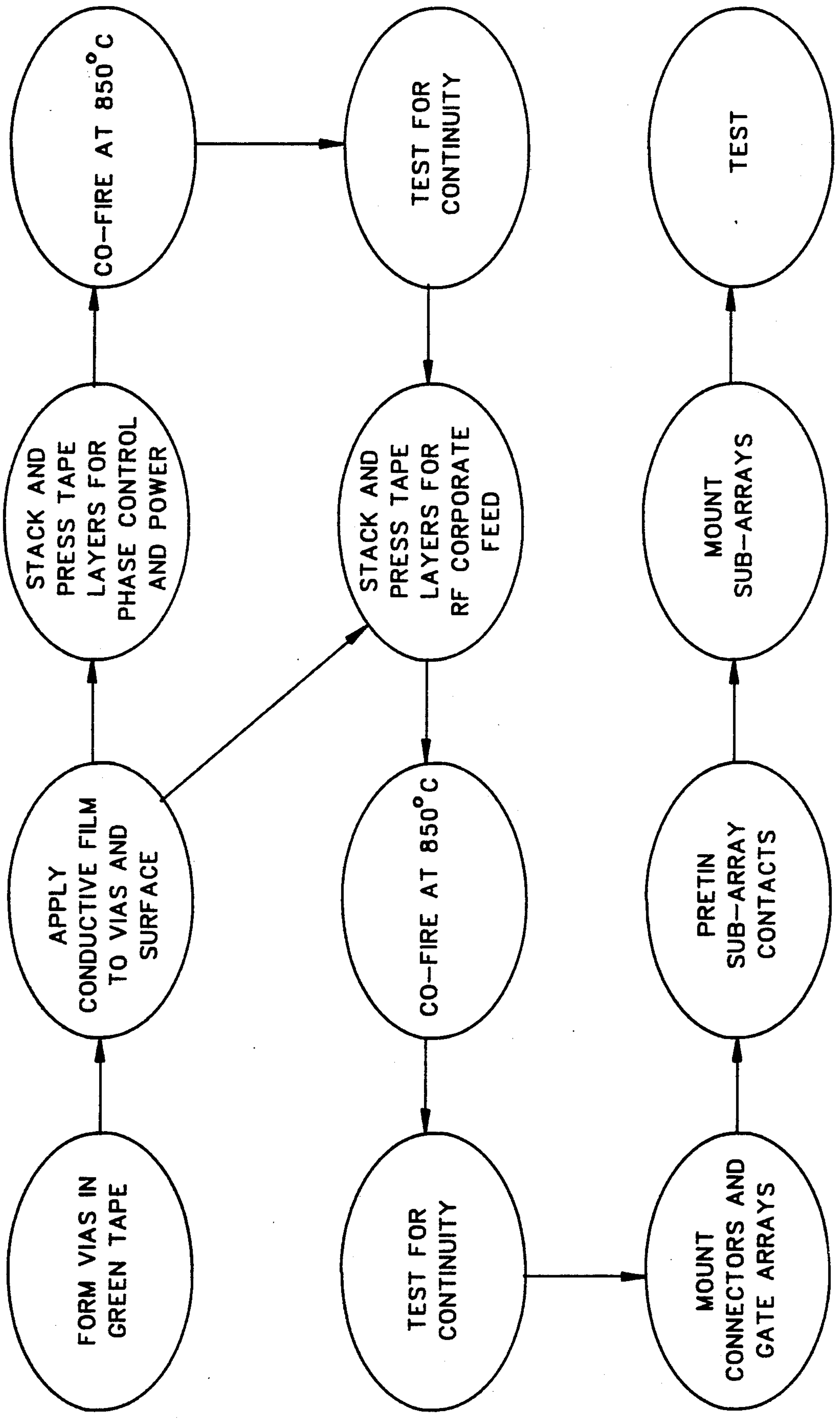
FIG. 4 illustrates a process flowchart for the manufacture of the assembly of FIG. 1.

Steps used in the construction of an exemplary backplate assembly 16, are illustrated in FIG. 4. The resulting structure of the backplate 16 is illustrated in more detail in FIGS. 5 and 6. The vias 92–102, in these figures are illustrated as positioned adjacent to each other in a straight line only for purposes of clarity. These vias may have a variety of configurations as disclosed above.

A complete backplate structure requires RF signal feeds, logic control lines for phase shifters, and DC bias lines at a minimum. The backplate assembly 16 is shown having 7 layers of ceramic material 50–62 interposed between 8 metallic or conductive layers 70–84 to meet these requirements. However, those skilled in the art will readily recognize that more or fewer layers may be employed within the teachings of the invention depending upon the specific application or circuit designs contemplated.

The backplate 16 is constructed by preparing a series of individual ceramic layers using uncured, or green, ceramic material. The ceramic is chosen to have a thermal expansion roughly that of the MMIC wafer to minimize breaking and warping of MMIC sub-arrays. An exemplary material is an alumina compound in the form of uncured ceramic tape. While other ceramic materials can be employed, alumina compounds provide desirable Coefficients of Thermal Expansion (CTE) and structural properties. Alumina compounds can also be lapped or polished to achieve precision tolerances and are widely available at low cost. As an example, a 94% alumina compound has a CTE of about 6.0 (PPM/°C) and GaAs can be made with a CTE of about 5.8, which provides an excellent thermal match.

Each layer of ceramic 50–62 is generally provided in a thickness which is determined by particular signal isolation requirements of circuits positioned adjacent to that layer, such as voltage standoff, dielectric constant, and capacitance. Exemplary layer thicknesses for EHF applications are about 0.014–0.015 inches, although others may be used. In the figures, the layers associated with the RF network are illustrated as being thicker than the remaining layers, to satisfy isolation and dielectric constant constraints. All layers typically have the same planar dimensions so that a uniform sized ceramic board is formed. However, the layers can be tailored for different shapes or specialized configurations.

Each ceramic layer has one or more conduction via holes 92–102 stamped, drilled, or otherwise formed in it which are then filled with a conductive material 86 in liquid or fluid form. The vias are typically circular in cross-section but can have other geometric shapes where desired. The conductive material 86 forms interconnections between opposite sides of each layer and, therefore, between adjacent ceramic layers. These interconnections form hybrid conductive vias which are combined to provide a vast array of interconnections for the MMIC circuits 12 through which RF, DC bias, and control signals will be transferred. A preferred conductive material 86 is a conductive ink such as, but not limited, to a liquid gold or silver ink. The ink forms a solid at elevated temperatures when the ceramic material is heated or fired.

The diameter or cross-sectional size of the vias 94–102 depends on the signal transfer requirements and include parameters such as resistance, current capacity, inductance, etc. For EHF applications, vias on the order of 0.013 inches are typical.

Circuit patterns or interconnections for interfacing with or controlling a given set of MMIC elements or functions are formed on each interior ceramic layer. This is accomplished using known deposition, coating, or plating techniques to place metallic layers in the form of predetermined conductive patterns on the ceramic. An exemplary method uses conductive ink, which is deposited using known masking techniques. The ink is then dried during processing and forms a solid metal pattern. The metallic material can also be etched using known techniques. Each conductive ink, like any metal, has a different resistivity which determines its application. Inks found useful in realizing the invention are thick film silver, gold, or platinum/gold with resistivities on the order of 1.8, 12.7, and 85 milli-ohms per centimeter respectively.

When the metal layers 70–82 are etched or otherwise patterned, a small area of conductive material 90 is left adjacent to where the conductive vias 92-102 extend through the layers 50–60, respectively. This small, typically circular, conductive layer or button completes the connection between adjacent ceramic layers when the backplate 16 is assembled into a unitary structure. The contact area or button 90 is preferably wider than the cross-section of the vias to reduce alignment constraints and assure proper contact. An isolation gap 88 is provided around the via contacts 90 for adjacent surface contact isolation.

In a typical backplate structure or assembly, an uppermost ceramic layer 50, closest to the MMIC, is used to support a RF ground plane or circuit 70 for a RF corporate stripline feed. A center conductor or interconnection circuit 72 for the RF feed is placed on the next ceramic material layer, 52. The pattern for the interconnection circuit can be adjusted to fit specific applications or requirements. One useful configuration is illustrated in general form in FIG. 7.

Figure 7:
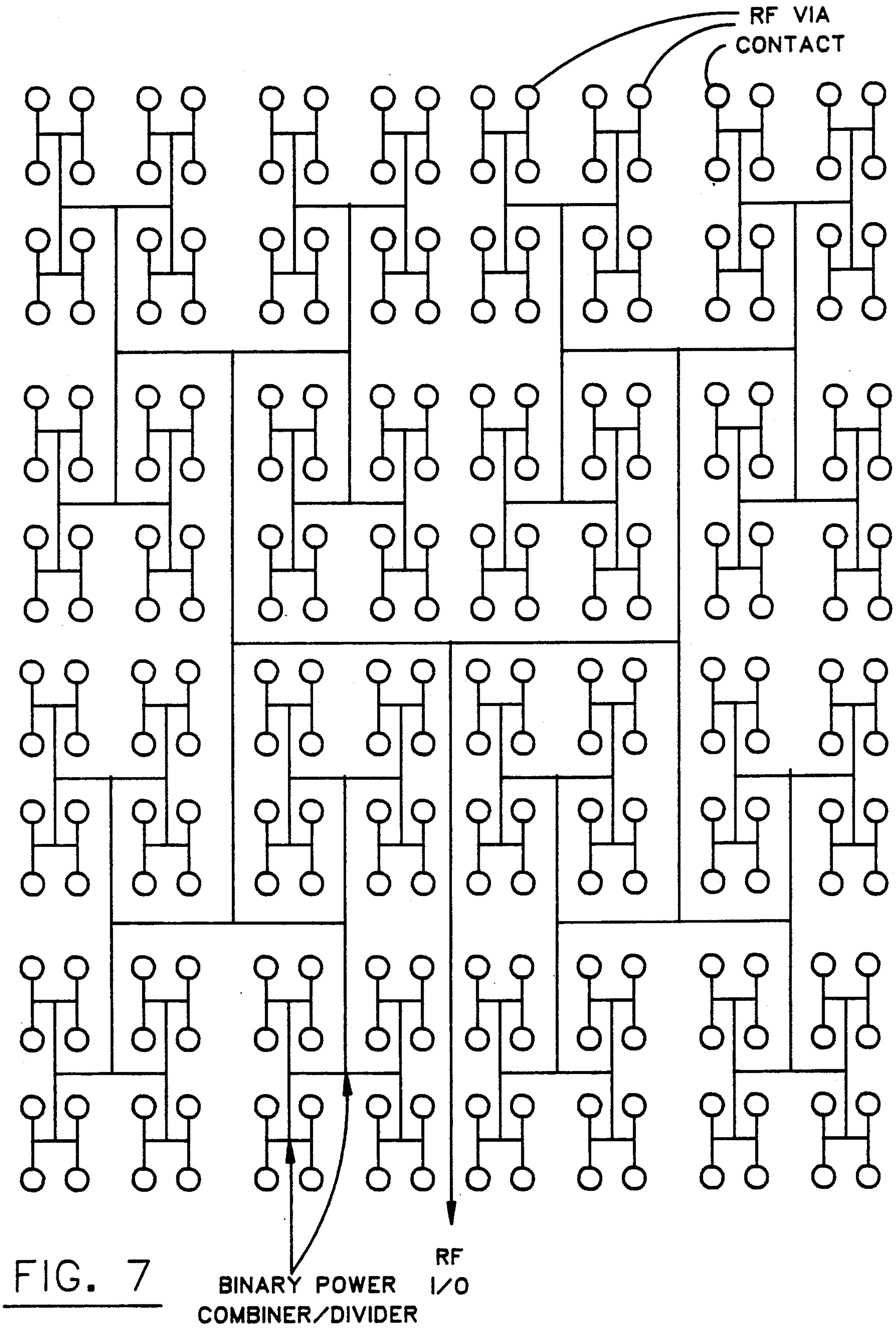
FIG. 7 illustrates a top view of the RF feed network employed in the backplate and module assembly of FIG. 5.

In FIG. 7, a single RF input/output line is shown being power divided into a series of successively subdivided RF transfer lines in the case of a transmit array, and combined with preceding RF transfer lines in the case of a receive array. This structure allows the RF signal to be efficiently transferred between a single signal line and the thousands of elements found in a typical array. For EHF applications, RF feed striplines are typically about 0.0005 inches thick and 0.016–0.030 inches wide to achieve a 40–50 ohms input/output line. A variety of junction structures can be employed for the power divider/combiner and for interfacing with the conductive vias, see below, as will be readily apparent to those skilled in the art. Junctions such as the Wilkinson Junction have been found useful to meet transfer needs or desired efficiencies at required bandwidth.

The connections of the RF stripline conductors to the MMIC module 14 are provided by the conductive vias 92. The next adjacent ceramic layer 54 supports a second ground plane 74 to complete the overall RF stripline. The stripline is a low loss shielded structure in which susceptibility to external RF interference is minimized. RF coupling is typically less than −90 dB. This structure is also less susceptible to electromagnetic interference and electromagnetic coupling.

Figure 5:
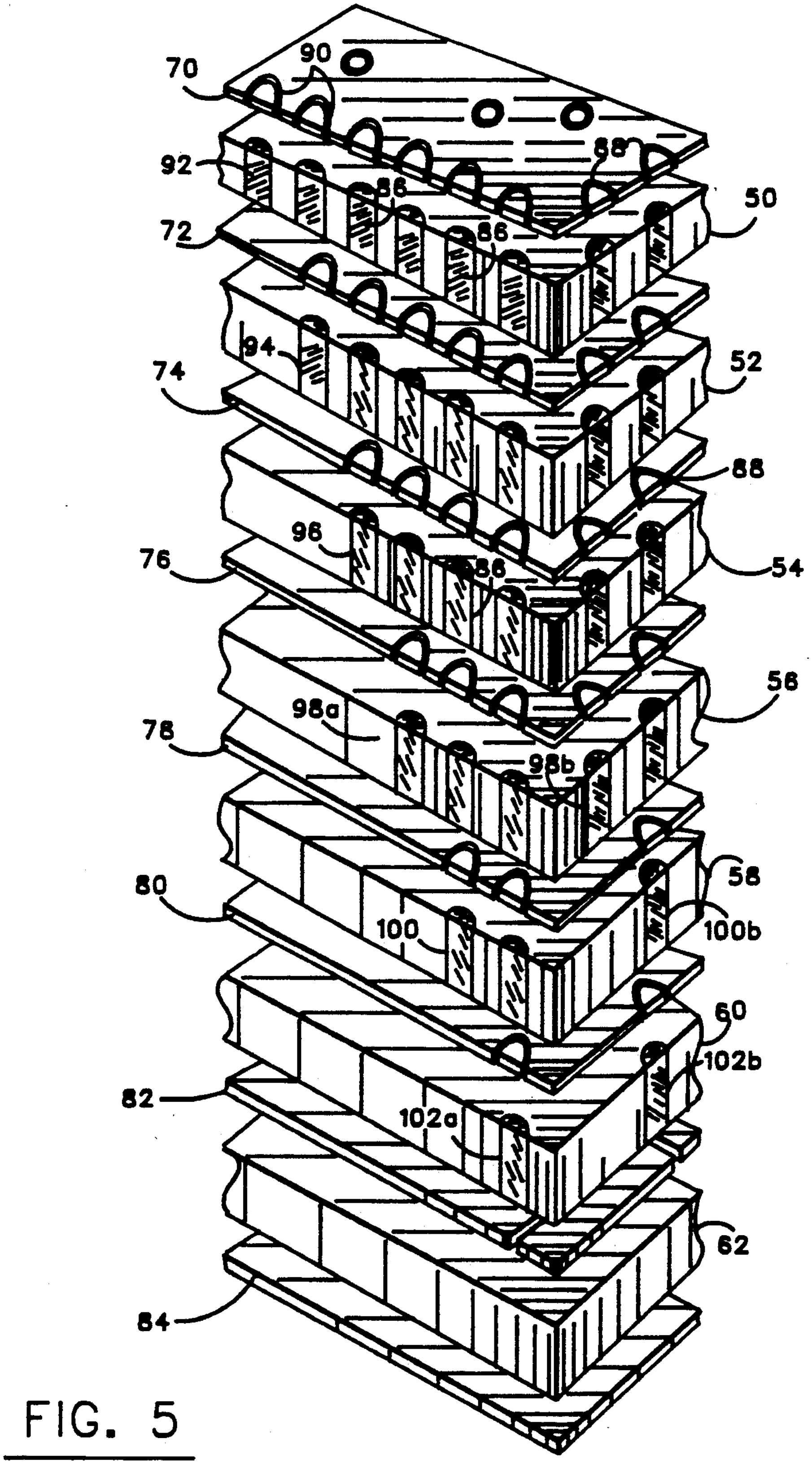
FIG. 5 illustrates an exploded, cut-away, side view of a backplate structure useful for manufacturing the assembly of FIG. 1 with the MMIC circuit modules of FIG. 2.
Figure 6:
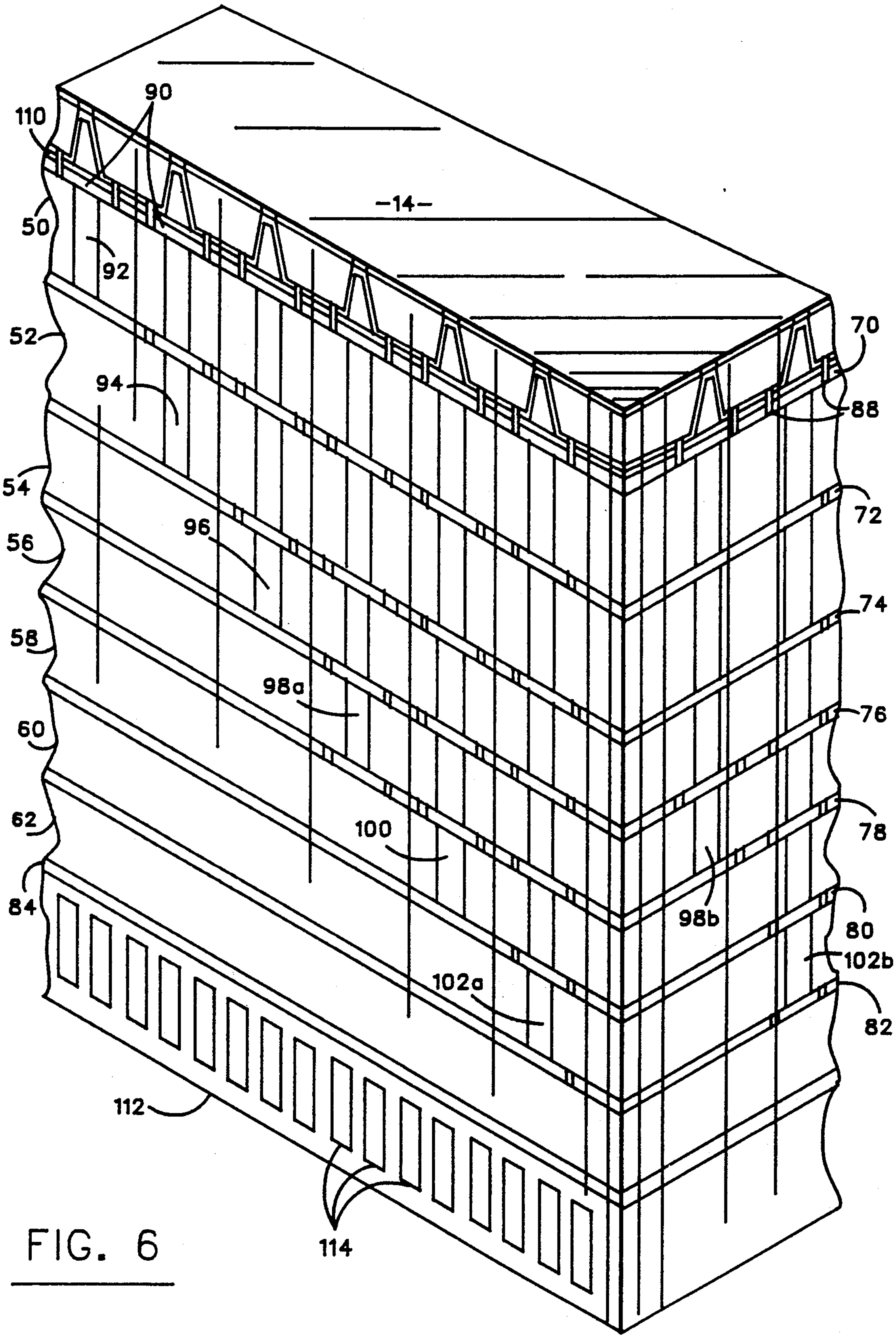
FIG. 6 illustrates a cut-away side view of the MMIC module of FIG. 2 bonded to the backplate of FIG. 4.

The succeeding layers of ceramic are covered with metallic interconnection patterns for circuit element functions such as amplifier bias and phase control. In FIGS. 5 and 6, the ceramic layers 56 and 58, support first and second amplifier bias connection layers or circuits 76 and 78, respectively, for amplifier drain and gate connections. Where two-stage MMIC LNAs and power amplifiers are used, they typically require three DC biases, one for an FET drain, and one for each FET gate. In the illustrated embodiment, the amplifier drain or ground bias is the same as one previously discussed RF ground which will reduce cross-talk among RF lines.

As can be seen in the Figures, each DC bias is connected by a via 96 or 98 which extends through the backplate 16, including the stripline RF feed 72. Once a given DC bias feedthrough reaches the MMIC module, it is connected to all amplifiers. This is illustrated using the vias 98*a* and 98*b* in FIG. 6. However, those skilled in the art will readily recognize that where a particular application desires separation of this connection, additional separately-connected conduction/ceramic layers can be provided.

All of the ceramic layers separating the amplifier and phase control inputs are made thick enough to reduce phase control line capacitance and to increase the physical strength of the backplate 16 or arrays 10.

Subsequent ceramic layers, such as layers 60 and 62, typically support control lines or conductive strips 80 and 82 for element phase control. The control lines 80 connect the phase control feedthrough vias 100 and 102 to the edge of the backplate 16 where they connect with phase control gate array integrated circuits 28. The integrated circuits 28 perform signal multiplexing or phase shifting, and are then connected to external circuitry through a unified connector. Additionally, the last ceramic layer generally supports a metallic layer 84 which comprises an independent ground or shielding plane.

By fabricating the array assembly 10 with phase control devices or ICs mounted on the backplate 16, phase control cabling is greatly reduced. Using conventional approaches, every 4 MMIC elements 12 would require four cables and result in 4096 cables for an array of 4096 elements. However, if 32 commercially available gate array logic integrated circuits are used on the array, typically eight on a side, only sixteen phase control cables or connections to external apparatus are needed. The use of backplate mounted and interconnected control logic by the present invention, allows the number of cable wires to the backplate assembly to be reduced by a factor of about 100 or more. In addition, the phase control lines in the backplate 16 are surrounded by high thermal conductivity ceramic which allows for improved cooling. This is desirable because of the high data rates typically employed. For example, changing phase every 62.5 microseconds requires loading three to four bits per element at a 16 MHz rate.

Returning now to FIG. 4, once the interconnection circuitry is deposited or formed on the separate layers, or as each is finished, they are aligned and stacked together into one form and "co-fired" at a high temperature to cure. This also causes the ceramic layers to fuse together to form a unitary multi-layer ceramic board with the RF, DC bias, and phase control networks embedded between layers. Alternatively, the individual layers can be "co-fired" as each additional layer is built or bonded using other known techniques once they are separately fired.

As shown in FIG. 4, it is typically expendient to co-fire a group of layers at one time and add the additional layers in stages. In this manner, the lower layers of the backplate 16 are prepared and co-fired first and the upper layers are added in subsequent steps. This also allows for continuity testing of functional layers such as the phase control or DC bias circuitry separate from RF or other interconnection circuitry.

The invention provides a greatly simplified electrical connection structure for an array apparatus because it can use one RF and one control and power connector. The off-array connections generally only require sixteen control, three power, and one ground connection each, respectively.

It can clearly be seen that the inventive method greatly reduces concerns over backplate handling since all critical RF and DC lines are buried within backplate layers.

The ceramic backplate 16 is now joined to each MMIC module 14 by application of a thin layer of a solder compound 110 to the top of the RF ground layer 70. While the ceramic board is being heated to melt the solder 110, the MMIC module 14 is aligned and mounted on the backplate 16. An exemplary solder is indium solder which has a melting point of about 157° C. The alignment can be made optically through use of various edge alignment techniques, optical marks placed on the MMIC and ceramic during manufacture, or using notches or similar devices.

Since the top and subsequent metallic layers, 70–82, are deposited with insulating gaps or breaks 88 around each via feedthrough, there are naturally occurring breaks in the solder around each MMIC via 34–40 connection. This isolation gap prevents electrical shorting of the contacts on each layer. Each MMIC substrate 30 is also provided with the ground layer 42 which is firmly bonded to the GaAs material. The solder 110 acts to bond the two ground layers, 42 and 70, and, thus, the modules 14 and backplate 16 together. While less useful for thermodynamic reasons, other materials such as epoxy can be used to bond each MMIC module 14 to the backplate 16 for low thermal loading applications.

A composite view of an array structure is illustrated in FIG. 6. In FIG. 6, the backplate 16 and MMIC modules 14 are assembled together to form one phased array structure 10. In many applications it may be necessary to dissipate 600 to 1000 watts, depending on transmit or receive operations. To provide for thermal dissipation, a separate cold plate 112 is attached to the underside of the ceramic backplate 16. The cooling plate 112 is preferably an air-cooled heat sink with air channels 114. The cooling plate 112 provides both structural rigidity and heat dissipation for the array 10. By maintaining a low temperature, typically less than 100° C., the reliability of the MMIC elements 12 or modules 14 are greatly increased. Mechanical stress due to thermal build-up is also reduced. The plate 112 also offers a strong surface for mounting of electrical connectors for RF, DC bias, and any related control signals.

The material used to manufacture the plate 112 needs to have a coefficient of expansion similar to that of the ceramic to prevent stress or warping. One method of addressing this problem is to use a metal laminate structure. This type of structure allows the composition of the heat sink to be adjusted to approximate or match the CTE of the ceramic. This leads to reduced stress from thermal loading and reduces backplate distortion of the heat sink to less than about 0.03 inches, or misalignment of the MMIC elements through substrate deflection to less than about 6 millionths of an inch. This in turn decreases array assembly 10 failure due to thermal or stress problems limiting reliability problems to the individual MMIC elements.

An exemplary metal structure would be a copper-molybdinum-copper alloy with concentrations ranging between about 20/60/20 and 25/50/25 which provides CTE values of about 6.8 to 7.9 which compares well with the CTE values for the GaAs and ceramic materials discussed above.

The overall thickness for the array 10 with the plate 112 added is typically on the order of 1.0 inch. This forms an array assembly thin enough to fit in confined or restricted spaces. At the same time, the array is light enough, between about 13 to 48 pounds for most applications, to meet most weight limitations and yet strong enough to handle most surface loads. The array 10 or sub-array 14 can also be curved or otherwise configured to various surface shapes by shaping the cooling plate 112 and the ceramic layers prior to curing. At the same time, the array 10 can obtain an extremely flat profile.

What has been described then is a new method and apparatus for manufacturing large MMIC arrays. The monolithic via hole technology on a ceramic substrate provides a low cost and reliable backplate. The construction method requires no wiring which simplifies fabrication, creates significant labor/cost savings and improves reliability. The invention uses standard commerically available batch processing approaches and will solve many of the problems associated with making a massive amount of electrical interconnections for a large array of MMIC elements. It will also help with the process of assembling a large array from many sub-arrays. The invention achieves array-to-array performance consistency.

The inventive structure also allows the backplate to be tested independent of sensitive MMIC sub-arrays. The assembly is not only easier to test, but as previously discussed can be tested in stages to monitor manufacturing operations. This reduces loss of MMICs due to pre-existing backplate damage while increasing delivered product reliability.

Those skilled in the art will recognize that only examples of possible RF feed and bias network configurations have been illustrated, and other configurations are possible. Additional ceramic layers or circuit feeding networks may be used for other array applications. This general feeding approach can also be extended to other transmission line applications. For example, a microstrip line can be deposited on a single layer of ceramic for an RF and DC feed network. In this case, a thinner ceramic backplate is used dependent upon applicable structural support requirements.

The foregoing description of preferred embodiments has been presented for purposes of illustration and description. It is not intended to be exhaustive nor to limit the invention to the precise forms disclosed, and many modifications and variations are possible in light of the above teaching. The embodiments were chosen and described to best explain the principles of the invention and its practical application to thereby enable others skilled in the art to best utilize the invention in various embodiments and with various modifications as are suited to the particular use contemplated. It is intended that the scope of the invention be defined by the claims and their equivalents.

What we claim as our invention is:

1. A backplate apparatus for use with an array of monolithic microwave integrated circuits, comprising:
- a plurality of electrically insulating material layers secured together, each having conductive vias extending therethrough at locations corresponding to preselected electrical signal transfer points for circuitry on at least one of said monolithic microwave integrated circuits and each having an electrical interconnection circuit deposited thereon for connection to different selected ones of said conductive vias so as to transfer signals therewith;
- at least one of said electrical interconnection circuits deposited on one insulating layer comprising a power divider for physically connecting a single RF transfer line to a plurality of selected ones of said conductive vias corresponding to a plurality of physical RF transfer contacts for said monolithic microwave integrated circuit; and
- at least one of said electrical interconnection circuits deposited on an adjacent insulating layer comprising a ground plane for said power divider.

2. A monolithic microwave integrated circuit array and backplate apparatus comprising:
- a multi-layer interface board comprising multiple layers of electrically insulating material, each having a predetermined thickness and a unique interconnection circuit deposited thereon;
- at least one first conductive via positioned across and extending through each insulating layer, each said via being electrically connected to one interconnection circuit;
- a monolithic microwave integrated circuit module comprising a generally planar substrate having opposing first and second generally planar surfaces with a desired monolithic microwave integrated circuit formed adjacent said first surface;
- second conductive vias extending through said substrate between said first and second surfaces at locations corresponding to, and in alignment with, desired signal contact points for said monolithic microwave integrated circuit; and
- joining means connected between said substrate second surface and said interface board for holding said substrate on said interface board with said first conductive vias in alignment and physical contact with corresponding ones of said second conductive vias, so as to provide signal transfer paths between said unique interconnection circuits and preselected ones of said circuit signal contacts.

3. The apparatus of claim 2 wherein said substrate comprises a predetermined thickness of GaAs.

4. The apparatus of claim 2 wherein said plurality of material layers each comprise ceramic material.

5. The apparatus of claim 4 wherein said plurality of ceramic material layers comprise:
- a plurality of substantially planar layers of ceramic of predetermined thickness stacked and bonded together;
- vias formed in each of said ceramic layers at predetermined positions corresponding to selected signal contacts for said monolithic microwave integrated circuit;
- first electrically conductive material deposited in said vias so as to extend through layers in which the vias reside; and
- second electrically conductive material deposited on each ceramic layer in the form of a unique preselected electrical interconnection patterns associated with the transfer of electrical signals for at least one of said monolithic microwave integrated circuit contacts.

6. The apparatus of claim 2 wherein said second conductive vias comprise a frustra-conical configuration with a base wider than an upper portion with said upper portion positioned adjacent said monolithic microwave integrated circuit contacts and said base positioned to contact said interface board.

7. The apparatus of claim 2 wherein said first conductive vias in each ceramic layer are in alignment with mating conductive vias in adjacent layers, so as to form composite electrically conductive vias extending through said material layers along a direction transverse to said layers.

8. The apparatus of claim 2 wherein said joining means comprises:
- an electrical interconnection pattern deposited on an uppermost layer of said interface board;
- first layer of metallic material bonded to said substrate; and solder material disposed between and in contact with said metallic material and said uppermost electrical interconnection pattern.

9. The apparatus of claim 8 wherein said electrical interconnection pattern comprises a ground plane.

10. The apparatus of claim 2 further comprising phase control logic circuit elements mounted on one or more material layers of said interface board and being electrically connected to said monolithic microwave integrated circuit through at least one of said interconnection circuits on one of said interior material layers so as to control relative phases of RE signals being processed by said monolithic microwave integrated circuit.

11. The apparatus of claim 2 wherein said MMIC second surface comprises a ground plane surrounding and spaced apart from said conductive vias.

12. The apparatus of claim 2 wherein said MMIC contains antenna elements.

13. A backplate apparatus for use with an array of monolithic microwave integrated circuits, comprising:

a plurality of substantially planar ceramic layers of predetermined thickness stacked and bonded together, each having conductive vias formed in said ceramic layers at predetermined positions corresponding to preselected signal transfer contacts for at least one of said monolithic microwave integrated circuits;

first electrically conductive material deposited in said vias so as to extend through layers in which the vias reside; and second electrically conductive material deposited on each ceramic layer in the form of a preselected unique electrical interconnection patterns associated with selected ones of said monolithic microwave integrated circuit contacts so as to transfer predetermined signals therewith, with a top most of said second interconnection circuits comprising a ground plane surrounding and spaced apart from said conductive vias.

* * * * *